United States Patent [19]

Paine et al.

[11] Patent Number: 4,570,329
[45] Date of Patent: Feb. 18, 1986

[54] APPARATUS AND METHOD FOR FABRICATING BACKSIDE MOSAIC OF PHOTOCONDUCTIVE INFRARED DETECTORS

[75] Inventors: Christopher G. Paine, Worcester; William J. White, Chelmsford, both of Mass.; Susan J. Resnick, Great Neck, N.Y.

[73] Assignee: Honeywell Inc., Minneapolis, Minn.

[21] Appl. No.: 641,075

[22] Filed: Aug. 15, 1984

[51] Int. Cl.[4] .................... H01L 21/98; H01L 31/18
[52] U.S. Cl. ...................................... 29/572; 29/576 J; 29/610 R; 29/831; 148/DIG. 80; 250/332; 357/30
[58] Field of Search .............. 29/572, 576 J, 577 R, 29/577 C, 590, 591, 610 R, 831; 148/DIG. 80; 250/332, 370 G, 370 J, 338 SE; 357/30, 32

[56] References Cited

U.S. PATENT DOCUMENTS

| | | | |
|---|---|---|---|
| 3,808,435 | 4/1974 | Bate et al. | 250/332 |
| 4,039,833 | 8/1977 | Thom | 250/332 |
| 4,290,844 | 9/1981 | Rotolante et al. | 29/572 X |
| 4,416,054 | 11/1983 | Thomas et al. | 29/572 |

*Primary Examiner*—Brian E. Hearn
*Assistant Examiner*—Alan E. Schiavelli
*Attorney, Agent, or Firm*—John S. Solakian; Laurence J. Marhoefer

[57] ABSTRACT

An apparatus and method for fabricating a backside contacted mosaic detector array which provides close detector packing in one or more directions by eliminating over the edge contacts typically used. The method uses indium or other coldweldable metal, both as a means for fastening the array from the backside to its circuit board and as a means for providing electrical contact with each detector.

16 Claims, 6 Drawing Figures

APPARATUS AND METHOD FOR FABRICATING BACKSIDE MOSAIC OF PHOTOCONDUCTIVE INFRARED DETECTORS

BACKGROUND OF THE INVENTION

The apparatus and method of the present invention relate generally to infrared detector elements, and more specifically to the fabrication techniques used to achieve closely packed one or two dimensional photoconductive mercury cadmium telluride infrared detector arrays.

Mercury cadmium telluride (HgCdTe) detectors are commonly used in scanning infrared optical systems. These detectors are constructed in a variety of configurations, for example in front-side illuminated photoconductive arrays or in backside illuminated photodiode arrays. In the past, these system designs have typically required close spacing of the detector elements in only one dimension.

Close spacing has been accomplished in front-side illuminated photoconductive arrays by detector fabrication techniques which use photoresist to define the detector edges in combination with either acid etching or ion beam milling to remove the extraneous detector material. In some systems, close spacing is required in two directions. However, in these cases it is desirable to use approaches that are as similar to those used in one dimensional arrays as possible.

For example, in one well-known fabrication technique, sometimes referred to as the "Z" technology, individual detector elements are formed (usually with nearly standard processing) on the edges of thin substrates which are then placed side by side to achieve close packing. Prior to stacking the arrays side by side, the detector electrode material is selectively deposited over the detector, epoxy and substrate edges, thus providing a detector electrical contact and defining the detector active area.

However, close spacing as required by recent optical system designs (i.e., 0.001 to 0.002 inches between detector active areas) are difficult to achieve using the Z technology. First, the Z technology requires a certain minimum detector spacing in order to bring the detector electrode up over the etched or milled substrate/detector edge. Second, this requires cutting through the glue bond between detector and substrate which invariably results in erosion of the detector active area. Finally, the process of contacting the detector to the underlying circuit board conductive pad requires additional space between detectors. These three aspects of the Z technology (bringing the contact up over the detector edge, glue cutting and contacting) require so much space between detectors that linear packing densities greater than ninety percent (90%) are difficult to achieve using detector elements placed 0.010 inch center-to-center.

It is, accordingly, a primary object of the present invention to provide a device and method for fabricating a detector array which may be used to construct detector array assemblies which are closely packed in either one or two directions.

SUMMARY OF THE INVENTION

The above and other objects of the present invention are achieved by constructing a backside contact mosaic detector array in which the space between detector elements is limited by using a flat, rather than over-the-edge electrode, and in which the space between individual detector elements is created by the techniques of either ion beam milling or acid etching.

BRIEF DESCRIPTION OF THE DRAWINGS

The objects of the present invention are achieved in the illustrative embodiments as described with respect to the Figures in which.

DETAILED DESCRIPTION OF THE PREFERRED EMBODIMENT(S)

Referring to FIGS. 2A, 2B, 2C and 2D, the method of fabrication of the mosaic detector array of the present invention is as follows. A prefabricated leadout wire matrix substrate 10 is prepared, having contact pads 12 at the proper points for eventual detector connection. This matrix substrate 10 may comprise, for example, either a multi-layer thin or thick film circuit board, or a multi-layer cofired ceramic circuit board. Contact pads 12 may comprise electrically conductive tracks or pads embedded within substrate 10, or may comprise thin deposition (for example, 100 microinch thick) pads deposited on the surface of substrate 10.

Figure 2A:
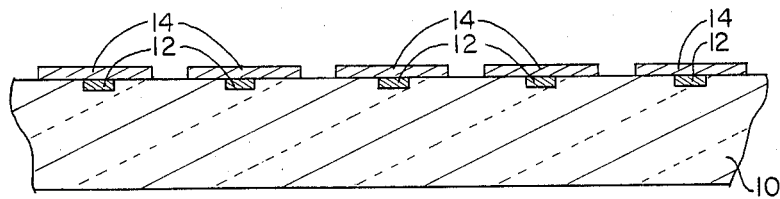
FIGS. 2A, 2B, 2C and 2D show cross-sections through the mosaic detector array of the present invention during progressive stages of the fabrication process.

As shown in FIG. 2A, deformable contact pads 14 are formed over contact pads 12 using well-known photo lift-off techniques. A deformable metal, such as indium, is used to form pads 14. Each deformable pad 14 covers a large area of substrate 10 without making electrical contact with other adjacent electrical contact pads 14.

Figure 1:
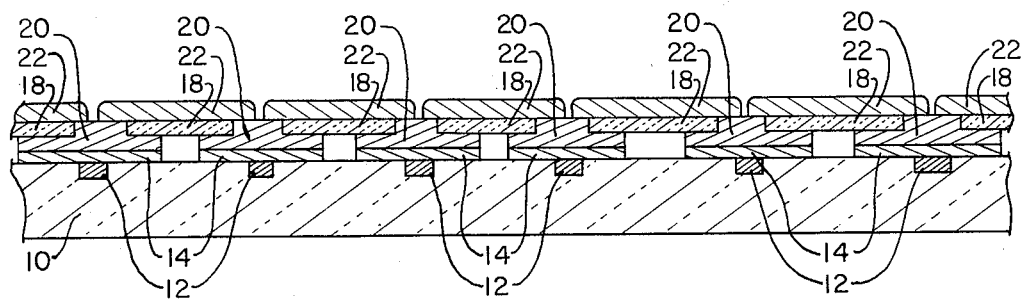
FIG. 1 shows a cross-section through the completed mosaic detector array of the present invention.
Figure 2B:
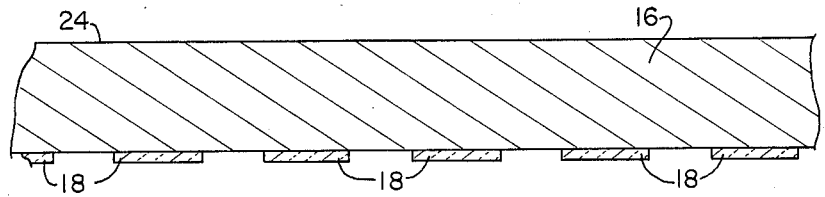
Figure 2C:
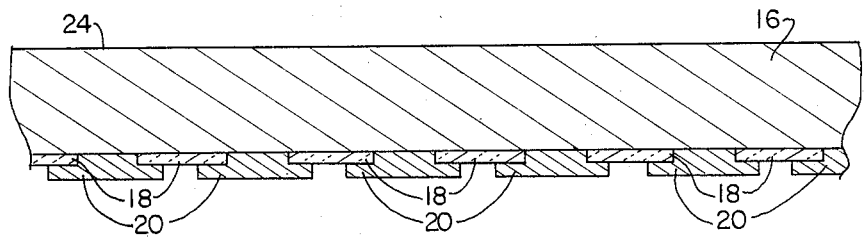

Referring to FIG. 2B, detector crystal slab 16 is prepared by a well-known technique such as lapping and etching. Insulator passivations 18 are deposited, e.g. by sputtering or evaporation, on crystal 16 in the region which will be between the photoconductor electrodes 20 of the finished detector elements 22 as shown in FIG. 1. Passivations 18 may comprise either zinc sulfide (ZnS), or a silicon oxide (SiO or $SiO_2$), or some other insulating material. Deformable metal contacts 20, which substantially match in size and location deformable contact pads 14 on substrate 10, are deposited over crystal 16 and insulation passivations 18, as shown in FIG. 2C.

Figure 2D:
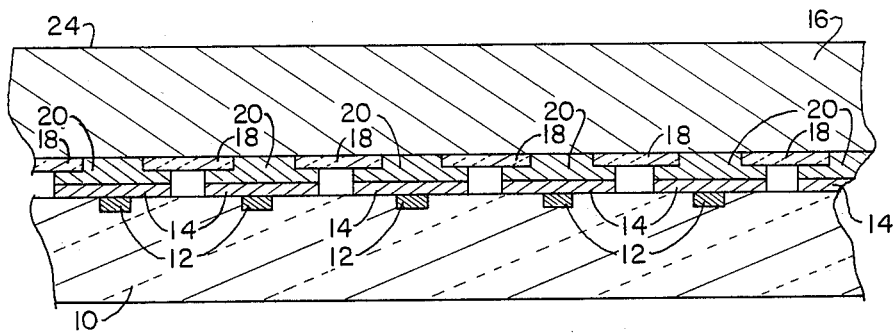

As shown in FIG. 2D, the deformable contact pads 20 on crystal 16 are pressed into contact with deformable contact pads 14 on substrate 10, thus coldwelding or reflow soldering crystal 16 and substrate 10. A minimum amount of pressure is used and some heat may be used to cause adherence in order to minimize the possibility of damaging crystal 16. For example, approximately 300 pounds per square inch pressure is required to cause adherence in indium, which is well below that pressure which may cause damage to a crystal slab 16 comprising HgCdTe.

In alternate embodiments, deformable contact pads 14 and 20 may comprise silver, aluminum or one or more layers of gold and/or titanium gold and/or chrome nickel gold. In addition, it should be noted that the relative thicknesses of pads 14 and 20 might vary significantly. In one embodiment, only contact 20 need be provided, since contact 20 may be directly cold-welded to contact 12. Once crystal 16 and the leadout wire matrix substrate 10 are in contact, some electrical testing, for example electrical continuity testing, may be performed to check the quality of the fabrication process.

As shown in FIG. 1, in the final processing steps, individual detector elements 22 are delineated from crystal 16. In some embodiments it may be desirable to secure crystal 16 to substrate 10 using, for example, an etchable adhesive in order to prevent damage to crystal 16. The top surface 24 of crystal 16 may then be lapped and/or etched to provide the desired thickness of detector elements 22. Individual detector elements are then delineated from the remaining material of crystal 16 by either etching, ion milling, or some other process compatible with delineation in the particular crystal material.

In an alternative embodiment, individual detector elements 22 may be formed and delineated from crystal 16 while mounted on a temporary substrate. Then, the completed detector assembly may be transferred to substrate 10 before final testing. In the alternate, shown in FIG. 1, detector spacing may be achieved by removing crystal material 16 over deformable contact pads 14 between insulation passivations 18.

Figure 3:
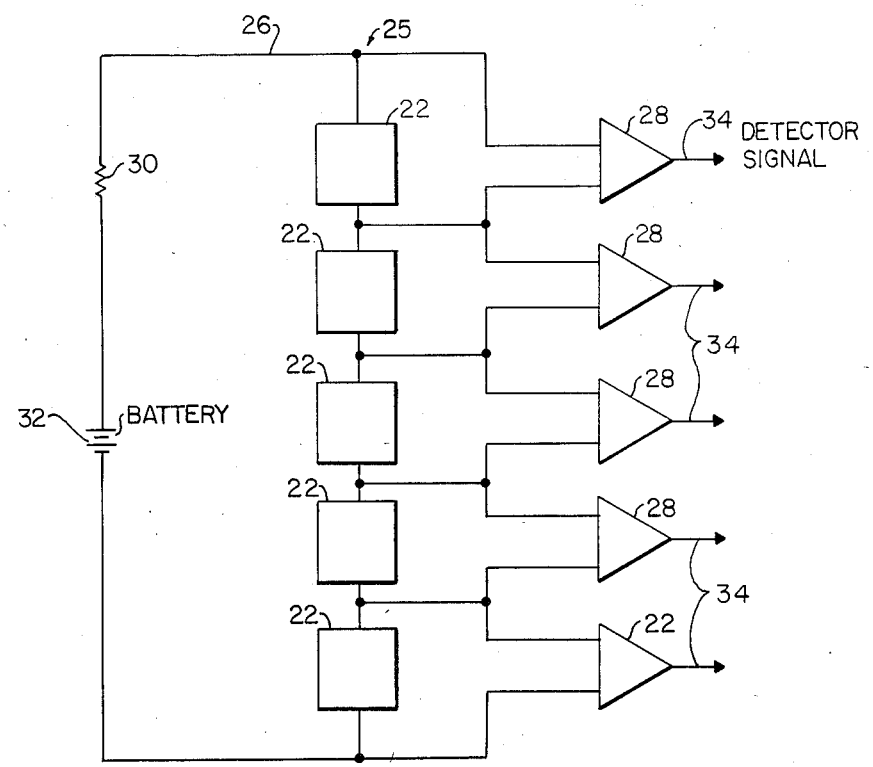
FIG. 3 shows a schematic of a mosaic detector array fabricated using the process of the present invention.

The fabrication process as described creates a series biased detector array which has a common current for each row 25 of detectors 22, as shown in FIG. 3. Thus, for a 10×10 matrix of detectors, ten bias lines 26 would be used, each series biasing ten detectors. Each detector signal 34 can then be read out differentially across the two adjoining contact pads 14, using differential preamplifiers 28, as shown. A series bias resistor 30 is provided for each detector row 24. The required bias source is provided by bias battery 32. It is understood, however, that in alternate embodiments the detector configuration may use individual rather than common contacts 14.

Having described the invention, what is claimed as new and novel and for which it is desired to secure Letters Patent is:

1. A method for fabricating a backside contacted photoconductive detector assembly from a first substrate wherein said detector assembly is electrically connected to exterior signal processing electronics by a second substrate having electrical contact pads, said method comprising the steps of:
    A. forming one or more of said first contact pads on said second substrate, wherein each of said first contact pads is positioned in a desired area of electrical connection to said second substrate, and wherein said first contact pads are positioned to avoid electrical contact between each of said first contact pads;
    B. forming one or more insulating passivations on a first surface of said first substrate, said passivations shaped to expose portions of said first surface of said first substrate;
    C. forming one or more first deformable contact pads on said first substrate wherein each of said first deformable contact pads is positioned between said passivations on said first surface and over said passivations threby forming a substantially planar exposed surface, wherein each of said first deformable contact pads is positioned such that it forms an electrical contact with said first substrate at said first surface, and wherein each of said first deformable contact pads provides electrical contact with said first contact pads on said second substrate;
    D. bringing said first and said second substrates into physical contact such that said first contact pads are in contact with said first deformable contact pads and wherein said first contact pads are physically connected to and electrically connected to said first deformable contact pads on said first substrate; and
    E. delineating at least two individual detector elements from said first substrate, wherein each of said elements covers each of said passivations, and such that said detector elements are in electrical contact with said first contact pads by means of said first deformable contact pads.

2. A method as in claim 1 wherein said step of forming said first contact pads comprises the steps of:
    A. depositing a first photoresist pattern on said second substrate;
    B. depositing a metal to form said first contact pads over said photoresist pattern; and
    C. lifting off said first photoresist pattern thereby leaving said first contact pads.

3. A method as in claim 2 wherein said first contact pads are deformable.

4. A method as in claim 1 wherein said step of forming said insulating passivations comprises the steps of:
    A. depositing a second photoresist pattern on said first surface of said first substrate;
    B. depositing an insulating material over said second photoresist pattern; and
    C. lifting off said second photoresist pattern thereby leaving said insulating passivations on said first surface of said first substrate.

5. A method as in claim 1 wherein said step of delineating further comprises the steps of:
    A. lapping the side of said first substrate opposite said first surface; and
    B. ion-milling said first substrate to delineate said individual detector elements.

6. A method as in claim 1 wherein said step of delineating further comprises the steps of:
    A. lapping the side of said first substrate opposite said first surface thereby creating a second surface;
    B. depositing a photoresist pattern on said second surface;
    C. selectively etching said first substrate to delineate said individual detectors; and
    D. removing said photoresist.

7. A method as in claim 1 wherein said first deformable contact pads comprise an electrically conductive material having high malleability.

8. A method as in claim 7 wherein said conductive material comprises indium, gold or aluminum.

9. A method as in claim 1 wherein said first substrate comprises mercury cadmium telluride.

10. A method as in claim 9 wherein said first deformable contact pads comprise indium.

11. A method as in claim 9 wherein said first contact pads comprise one or more layers of gold and/or titanium gold and/or chrome nickel gold.

12. A method as in claim 9 wherein said step of forming said first contact pads comprises the steps of:
    A. depositing a first photoresist pattern on said second substrate;
    B. depositing a metal over said photoresist pattern to form said first contact pads; and C. lifting off said first photoresist pattern thereby leaving said first contact pads.

14. A method as in claim 12 wherein said first contact pads comprise a thin layer of gold.

14. A method as in claim 12 wherein said first contact pads comprise a deformable indium layer.

15. A method as in claim 1 wherein said passivations comprise sputtered or evaporated zinc sulfide.

16. A method as in claim 1 wherein said first substrate comprises delineated detector elements mounted on a temporary carrier, which may be removed after said step of bringing said first and second substrates into physical contact.

* * * * *